(12) United States Patent
Moon et al.

(10) Patent No.: US 11,700,750 B2
(45) Date of Patent: Jul. 11, 2023

(54) DISPLAY DEVICE AND METHOD OF MANUFACTURING THE SAME

(71) Applicant: Samsung Display Co., Ltd., Yongin-si (KR)

(72) Inventors: Junhwan Moon, Yongin-si (KR); Younggil Kwon, Yongin-si (KR); Seul Lee, Yongin-si (KR); Jihee Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 240 days.

(21) Appl. No.: 17/104,389

(22) Filed: Nov. 25, 2020

(65) Prior Publication Data

US 2021/0104587 A1 Apr. 8, 2021

Related U.S. Application Data

(62) Division of application No. 16/162,148, filed on Oct. 16, 2018, now Pat. No. 10,879,323.

(30) Foreign Application Priority Data

Dec. 26, 2017 (KR) ........................ 10-2017-0179804

(51) Int. Cl.
  *G03F 7/40* (2006.01)
  *H10K 59/122* (2023.01)
  (Continued)

(52) U.S. Cl.
  CPC ............. *H10K 59/122* (2023.02); *G03F 7/40* (2013.01); *H10K 50/805* (2023.02); *H10K 50/824* (2023.02); *H10K 59/124* (2023.02); *H10K 71/00* (2023.02); *H10K 71/221* (2023.02); *H10K 71/233* (2023.02); *H10K 59/1201* (2023.02); *H10K 59/35* (2023.02)

(58) Field of Classification Search
  CPC . H01L 27/3246; H01L 27/3276; H01L 51/56; H01L 51/0097; H01L 27/124; H01L 27/3244; H10K 59/122; H10K 50/814; H10K 71/221
  See application file for complete search history.

(56) References Cited

U.S. PATENT DOCUMENTS

| 2013/0236999 A1 | 9/2013 | Lee et al. |
| 2014/0127625 A1 | 5/2014 | Defranco et al. |
| (Continued) | | |

FOREIGN PATENT DOCUMENTS

| JP | 2002-352953 A | 12/2002 |
| JP | 2002-352963 A | 12/2002 |
| (Continued) | | |

*Primary Examiner* — Jaehwan Oh
(74) *Attorney, Agent, or Firm* — Lewis Roca Rothgerber Christie LLP

(57) ABSTRACT

Provided are a display device and a method of manufacturing the same. The display device includes a substrate; a pixel electrode on the substrate; a pixel-defining layer having a first opening exposing a central portion of the pixel electrode and a barrier portion defining the first opening; an auxiliary electrode on the barrier portion; an intermediate layer on the pixel electrode; and an opposite electrode on the intermediate layer and in electrical contact with the auxiliary electrode.

9 Claims, 10 Drawing Sheets

(51) Int. Cl.
      *H10K 50/805*       (2023.01)
      *H10K 50/824*       (2023.01)
      *H10K 59/124*       (2023.01)
      *H10K 71/00*       (2023.01)
      *H10K 71/20*       (2023.01)
      *H10K 59/35*       (2023.01)
      *H10K 59/12*       (2023.01)

(56) References Cited

U.S. PATENT DOCUMENTS

| | | | |
|---|---|---|---|
| 2014/0353633 A1* | 12/2014 | Lee | H10K 59/121 |
| | | | 438/34 |
| 2015/0001495 A1* | 1/2015 | Choung | H10K 71/18 |
| | | | 257/40 |
| 2016/0097977 A1 | 4/2016 | Ober et al. | |
| 2016/0329530 A1 | 11/2016 | Park et al. | |
| 2017/0104181 A1* | 4/2017 | Lee | H10K 59/122 |
| 2019/0334112 A1* | 10/2019 | Lee | H10K 50/844 |
| 2020/0411614 A1* | 12/2020 | Kim | H10K 50/814 |

FOREIGN PATENT DOCUMENTS

| | | |
|---|---|---|
| JP | 2007-165215 A | 6/2007 |
| KR | 2002-0006306 A | 1/2002 |
| KR | 10-2011-0009708 A | 1/2011 |
| KR | 10-2014-0139710 A | 12/2014 |
| KR | 10-2015-0026045 A | 3/2015 |
| KR | 10-2016-0038174 A | 4/2016 |
| KR | 10-2016-0047052 A | 5/2016 |
| KR | 10-2017-0043697 A | 4/2017 |

\* cited by examiner

DISPLAY DEVICE AND METHOD OF MANUFACTURING THE SAME

CROSS-REFERENCE TO RELATED APPLICATIONS

This application is a divisional of U.S. patent application Ser. No. 16/162,148, filed on Oct. 16, 2018, which claims priority to and the benefit of Korean Patent Application No. 10-2017-0179804, filed on Dec. 26, 2017, in the Korean Intellectual Property Office, the entire content of which is incorporated herein by reference.

BACKGROUND

1. Field

One or more example embodiments relate to a display device and a method of manufacturing the same, and for example, to a display device provided with a high-quality intermediate layer and/or a conductive layer on a pixel electrode, and a method of manufacturing the same.

2. Description of the Related Art

An organic light-emitting display device is a display device in which each of pixels includes an organic light-emitting diode. The organic light-emitting diode includes a pixel electrode, an opposite electrode facing the pixel electrode, and an emission layer interposed between the pixel electrode and the opposite electrode.

In the case of an organic light-emitting display device implementing full color, light of different colors is emitted for each pixel region, and an emission layer of each of pixels and an opposite electrode integrally formed in the plurality pixels may be formed using a deposition mask. As the resolution of the organic light-emitting display device is gradually increased, the width of an open slit of a mask used in a deposition process is gradually narrowed, and distribution thereof should be further reduced. Further, in order to manufacture a high-resolution organic light-emitting display device, a shadow effect should be reduced or removed. Accordingly, a method in which a deposition process is performed while a substrate and a mask are in close contact with each other may be used.

However, when the deposition process is carried out while the substrate and the mask are in close contact with each other, the mask may damage a pixel-defining layer. In order to prevent or reduce this effect, a spacer may be arranged on the pixel-defining layer. However, this adds a further process, and a thickness of the organic light-emitting display device increases due to the spacer.

SUMMARY

One or more example embodiments include a display device provided with a high-quality intermediate layer and/or a conductive layer on a pixel electrode, and a method of manufacturing the same. However, this is merely an example, and the scope of the present disclosure is not limited thereto.

Additional aspects of embodiments will be set forth in part in the description which follows and, in part, will be apparent from the description, or may be learned by practice of the presented example embodiments.

According to one or more example embodiments, a display device includes: a substrate; a pixel electrode on the substrate; a pixel-defining layer having a first opening exposing a central portion of the pixel electrode and a barrier portion defining the first opening; an auxiliary electrode on the barrier portion; an intermediate layer on the pixel electrode; and an opposite electrode on the intermediate layer and in electrical contact with the auxiliary electrode.

The auxiliary electrode may include aluminum (Al).

The intermediate layer may contact the auxiliary electrode.

The opposite electrode may expose at least a portion of the auxiliary electrode.

The auxiliary electrode may have a second opening exposing the central portion of the pixel electrode, and the second opening may be greater than the first opening.

According to one or more example embodiments, a display device includes: a substrate; a plurality of pixel electrodes spaced apart from each other and patterned on the substrate; a pixel-defining layer having a plurality of first openings exposing a central portion of each of the plurality of pixel electrodes; an auxiliary electrode extending in a first direction on the pixel-defining layer; a plurality of intermediate layers arranged on the plurality of pixel electrodes, respectively; and a plurality of opposite electrodes respectively arranged on the plurality of intermediate layers so as to face the plurality of pixel electrodes and in electrical contact with the auxiliary electrode.

The auxiliary electrode may include Al.

Each of the plurality of intermediate layers may contact the auxiliary electrode.

Each of the plurality of intermediate layers may be arranged spaced apart from each other.

A distance between each of the plurality of opposite electrodes may be less than a width of the auxiliary electrode.

The auxiliary electrode may have a plurality of second openings corresponding to each of the plurality of first openings, and the second openings may be greater than the first openings (e.g., the second openings may have apertures that are larger than those of the respective first openings).

According to one or more example embodiments, a method of manufacturing a display device includes: forming a pixel electrode on a substrate; forming a pixel-defining layer having a first opening exposing a central portion of the pixel electrode and a barrier portion defining the first opening; forming a first photosensitive layer on the pixel electrode so as to cover the first opening; forming an auxiliary electrode having a second opening exposing the first photosensitive layer on the barrier portion; forming a second photosensitive layer having a third opening exposing the first photosensitive layer on the auxiliary electrode; and removing the first photosensitive layer and the second photosensitive layer.

The forming of the first photosensitive layer may include forming a first photosensitive material on the entire surface of the substrate to cover the pixel-defining layer and the central portion of the pixel electrode and patterning the first photosensitive material.

The forming of the auxiliary electrode may include forming a conductive material on the entire surface of the substrate to cover the first photosensitive layer and patterning the conductive material to form a second opening, and the forming of the second photosensitive layer may include forming a second photosensitive material on the conductive material, and patterning the second photosensitive material to form a third opening.

The forming of the second opening and the forming of the third opening may be performed concurrently (e.g., simultaneously).

The second opening may be greater than the first opening.

The method may further include: forming a non-photosensitive layer on the auxiliary electrode; forming a shadow layer having a first open area on the non-photosensitive layer to correspond to the pixel electrode; forming a second open area in the non-photosensitive layer, which is greater than the first open area, to correspond to the first open area; forming an intermediate layer on the pixel electrode through the first open area and the second open area; and forming an opposite electrode on the intermediate layer through the first open area and the second open area.

The intermediate layer and the opposite electrode may contact the auxiliary electrode.

The second open area may be formed to be greater than the second opening of the auxiliary electrode to expose at least a portion of the auxiliary electrode.

The auxiliary electrode may include Al.

These general and specific embodiments may be implemented by using a system, a method, a computer program, or a combination thereof.

BRIEF DESCRIPTION OF THE DRAWINGS

These and/or other aspects of embodiments will become apparent and more readily appreciated from the following description of the example embodiments, taken in conjunction with the accompanying drawings in which.

DETAILED DESCRIPTION

Figure 1:
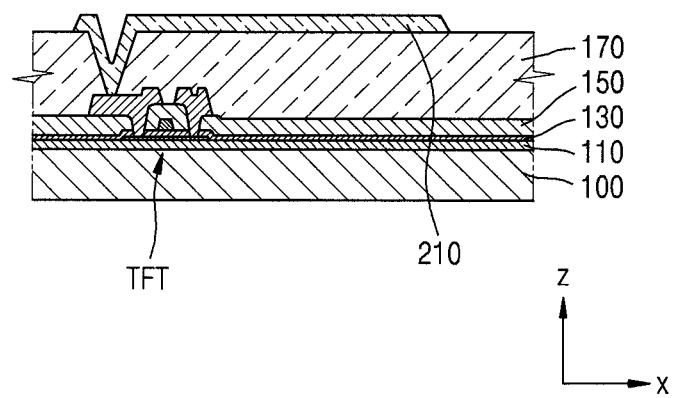
FIGS. 1-11 are cross-sectional views for illustrating a method of manufacturing a display device according to an embodiment.

Reference will now be made in more detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of embodiments of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be understood that the terms such as "include," "comprise," and "have" used herein specify the presence of stated features or components, but do not preclude the presence or addition of one or more other features or components. It will be further understood that when a layer, region, or component is referred to as being "on" another layer, region, or component, it can be directly or indirectly on the other layer, region, or component. For example, intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

An x-axis, a y-axis and a z-axis are not limited to three axes of a rectangular coordinate system and may be interpreted in a broader sense. For example, the x-axis, the y-axis, and the z-axis may be perpendicular (e.g., substantially perpendicular) to one another or may represent different directions that are not perpendicular (e.g., not substantially perpendicular) to one another.

When a certain embodiment may be implemented differently, a specific process order may be performed differently from the described order. For example, two consecutively described processes may be performed substantially at the same time or performed in an order opposite to the described order.

FIGS. 1-11 are cross-sectional views for illustrating a method of manufacturing a display device according to an embodiment.

Referring first to FIG. 1, a pixel electrode 210 may be formed on a substrate 100.

Various suitable layers may be formed before the pixel electrode 210 is formed on the substrate 100. FIG. 1 shows that a thin-film transistor TFT and a storage capacitor Cst are formed on the substrate 100 and a planarization insulating layer 170 covering the thin-film transistor TFT and the storage capacitor Cst is formed, and then the pixel electrode 210 is formed on the planarization insulating layer 170.

The substrate 100 may be formed of various suitable materials such as a glass material, a metal material, and/or a plastic material such as polyethylene terephthalate (PET), polyethylene naphthalate (PEN), and/or polyimide. A buffer layer 110 formed to prevent impurities from penetrating into (or to reduce such penetration of impurities into) a semiconductor layer of the thin-film transistor TFT, a gate insulating layer 130 for insulating the semiconductor layer of the thin-film transistor TFT from a gate electrode, an interlayer dielectric layer 150 for insulating a source electrode/drain electrode of the thin-film transistor TFT from the gate electrode, and a planarization layer 170 having a substantially flat top surface covering the thin-film transistor TFT may be formed on the substrate 100.

The buffer layer 110 may include an oxide film such as silicon oxide (SiOx) and/or a nitride film such as silicon nitride (SiN), and the gate insulating layer 130 and the interlayer dielectric layer 150 may include silicon oxide ($SiO_2$), silicon nitride (SiN), silicon oxynitride (SiON), aluminum oxide ($Al_2O_3$), tantalum oxide ($Ta_2O_5$), hafnium oxide ($HfO_2$), or zinc oxide ($ZrO_2$). The planarization insulating layer 170 may include an organic material such as acryl, benzocyclobutene (BCB), polyimide, or hexamethyldisiloxane (HMDSO). The buffer layer 110, the gate insulating layer 130, the interlayer dielectric layer 150, and the planarization insulating layer 170 may be a monolayer or a multilayer.

FIG. 1 shows that an insulating layer from the buffer layer 110 to the planarization insulating layer 170, but the present disclosure is not limited thereto. In another embodiment, an insulating layer may be further arranged according to a structure of the thin-film transistor TFT and a storage capacitor.

The pixel electrode 210 may include a conductive oxide such as indium tin oxide (ITO), indium zinc oxide (IZO), zinc oxide (ZnO), indium oxide (In2O3), indium gallium oxide (IGO), or aluminum zinc oxide (AZO). Alternatively, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and/or a film formed of ITO, IZO, ZnO, or In2O3 on the above reflective layer. The pixel electrode 210 may be a monolayer or a multilayer.

The pixel electrode 210 may be formed, for example, by forming a layer including materials forming the pixel electrode 210 on the planarization insulating layer 170 and then wet-etching the layer.

Figure 2:
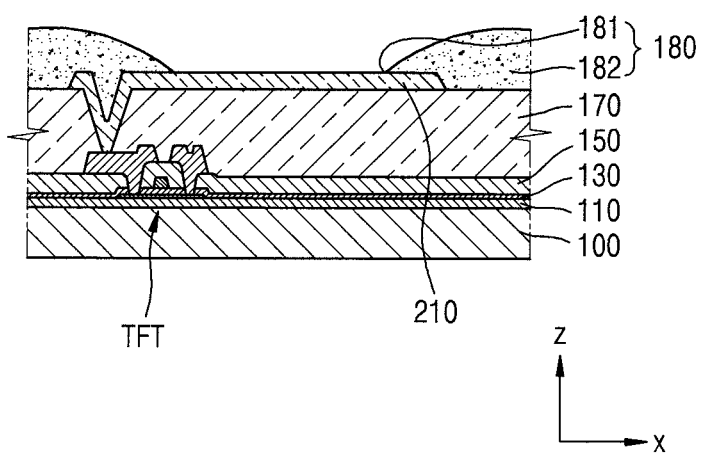

Referring to FIG. 2, an insulating layer 180 (hereinafter, referred to as a pixel-defining layer) including a first opening 181 overlapping the pixel electrode 210 and a barrier portion 182 defining the first opening 181 is formed.

The pixel electrode 210 is exposed through the first opening 181 of the pixel-defining layer 180. The barrier portion 182 of the pixel-defining layer 180 may prevent an arc from being generated (or may reduce a likelihood or amount of generation of such an arc) at the end of the pixel electrode 210 by increasing a distance between the end of the pixel electrode 210 and an opposite electrode 230 to be described herein below.

The pixel-defining layer 180 may include an organic material and/or an inorganic material, and may be formed as a monolayer or a multilayer. The organic material may include olefin-based organic materials, acrylic-based organic materials, imide-based organic materials, and the like. The imide organic material may be, for example, polyimide (PI). The inorganic material may include SiO2 or SiN.

When the pixel-defining layer 180 includes an organic material, a baking process may be performed after the pixel-defining layer 180 is formed. For example, after the pixel-defining layer 180 is formed, remaining gas in the organic material of the pixel-defining layer 180 may be removed by baking the pixel-defining layer 180 at a temperature of about 250° C. for about 1 hour.

Figure 3:
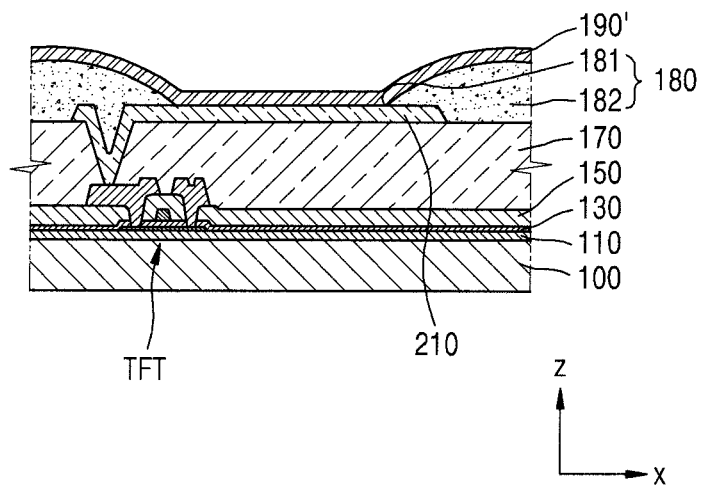

Referring to FIG. 3, a first photosensitive material 190' may be coated on the pixel-defining layer 180. The first photosensitive material 190' may be applied to the entire (e.g., substantially the entire) surface of the substrate 100 so as to cover the pixel-defining layer 180 and the pixel electrode 210 exposed by the first opening 181 of the pixel-defining layer 180. The first photosensitive material 190' may be a photoresist (PR). Accordingly, the first photosensitive material 190' may be patterned into a first photosensitive layer 190 to be described herein below through a post-exposure development process.

Figure 4:
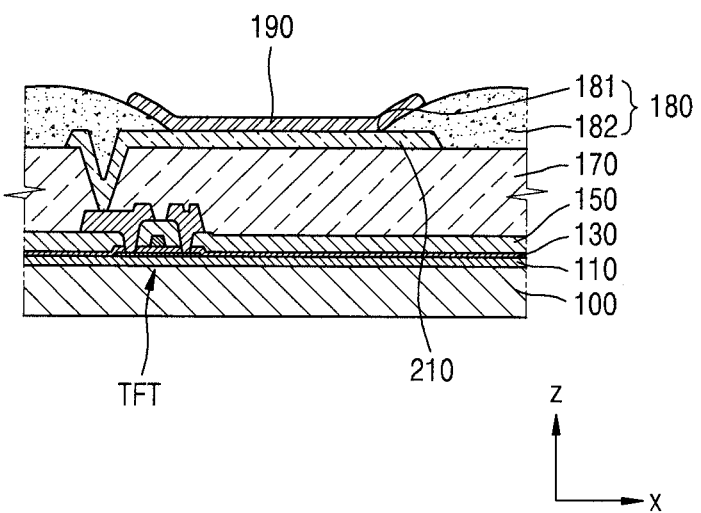

Referring to FIG. 4, the first photosensitive layer 190 may be formed on the pixel electrode 210 by patterning the first photosensitive material 190'. The first photosensitive layer 190 may be formed on the exposed pixel electrode 210 through the first opening 181 and may cover the first opening 181. For example, the fact that the first photosensitive layer 190 covers the first opening 181 means that the first photosensitive layer 190 is formed to be greater than the first opening 181 in a plan view. As shown in FIG. 4, the first photosensitive layer 190 may be formed to extend toward the barrier portion 182 of the pixel-defining layer 180. A central portion of the pixel electrode 210 exposed through the first opening 181 may be completely covered by the first photosensitive layer 190.

Figure 5:
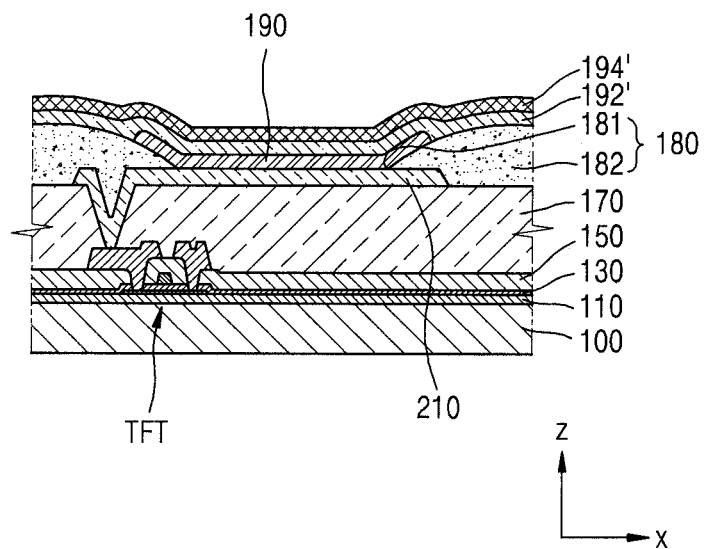

Referring to FIG. 5, a layer including a conductive material 192' may be formed on the first photosensitive layer 190 to cover the first photosensitive layer 190. Thereafter, a layer including a second photosensitive material 194' may be formed on the layer including the conductive material 192'. Here, the layer including the conductive material 192' and the layer including the second photosensitive material 194' may be formed on the entire (e.g., substantially the entire) surface of the substrate 100.

The layer including the conductive material 192' may be formed on the substrate 100 by a coating method, a printing method, a deposition method, or the like. In an embodiment, the conductive material 192' may include Al.

Further, the second photosensitive material 194' may be a PR. In an embodiment, the second photosensitive material 194' may be the same (e.g., substantially the same) material as the first photosensitive material 190' or may be a different material.

Figure 6:
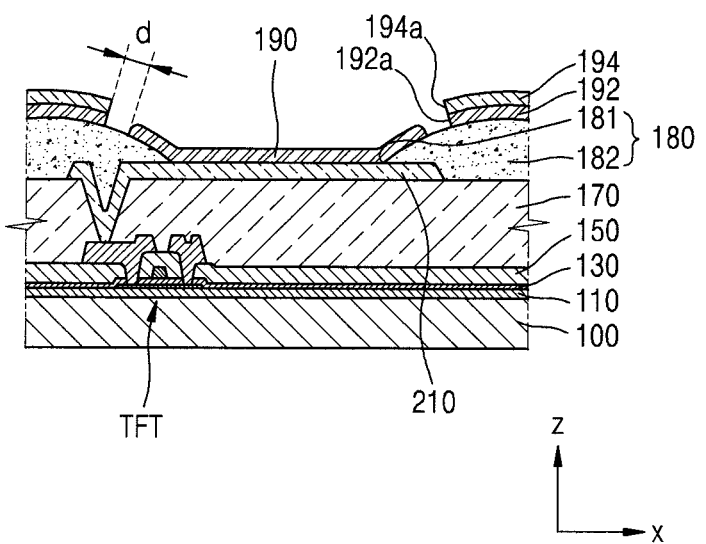

Referring to FIG. 6, a portion of the layer including the conductive material 192' and a portion of the layer including the second photosensitive material 194' may be collectively removed to form an auxiliary electrode 192 and a second photosensitive layer 194.

The auxiliary electrode 192 and the second photosensitive layer 194 may be formed on the barrier portion 182 of the pixel-defining layer 180. In an embodiment, a portion of the conductive material 192' and a portion of the second photosensitive material 194' may be removed by etching, wherein a material capable of concurrently (e.g., simultaneously) etching the second photosensitive material 194' and the conductive material 192' may be used as an etchant. For example, in a process of forming the auxiliary electrode 192 and the second photosensitive layer 194, a solvent capable of concurrently (e.g., simultaneously) etching the second photosensitive material 194' and the conductive material 192', such as tetramethyl ammonium hydroxide (TMAH) and the like may be used.

In more detail, the auxiliary electrode 192 may include Al in an embodiment as described above. The auxiliary electrode 192 may have a second opening 192a that exposes the first opening 181. The fact that the second opening 192a exposes the first opening 181 may mean that the second opening 192a is formed to be greater than the first opening 181 in a plan view (e.g., the second opening 192a may have an opening or aperture that is larger than that of the first opening 181, for example, larger in terms of diameter).

The second photosensitive layer 194 may have a third opening 194a, and the size of the third opening 194a may be the same (e.g., substantially the same) as the size of the second opening 192a as shown in FIG. 6. The auxiliary electrode 192 and the second photosensitive layer 194 may have an identical etching surface because the auxiliary electrode 192 and the second photosensitive layer 194 are formed through collective etching, and thus, the size of the third opening 194a may be the same (e.g., substantially the same) as the size of the second opening 192a.

Meanwhile, the second opening 192a of the auxiliary electrode 192 and the first photosensitive layer 190 may be spaced apart from each other by a set (or predetermined) distance d. A portion of the pixel-defining layer 180 may be exposed through the set (or predetermined) distance d between the second opening 192a of the auxiliary electrode 192 and the first photosensitive layer 190. The first photosensitive layer 190 may be entirely (e.g., substantially entirely) exposed through the second opening 192a of the auxiliary electrode 192.

Figure 7:
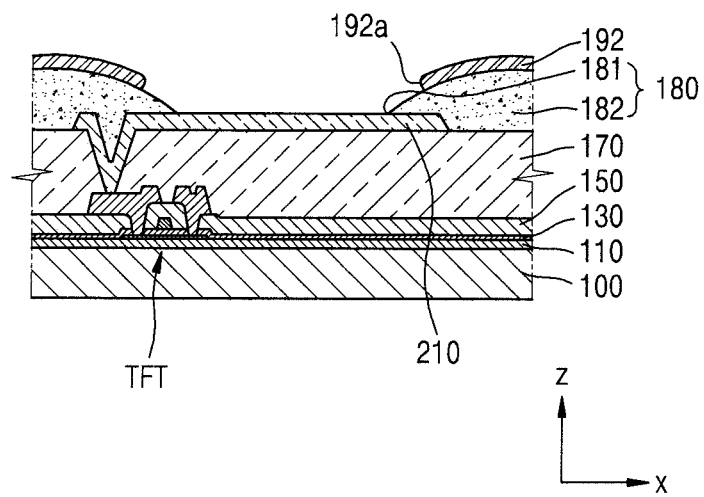

Referring to FIG. 7, the first photosensitive layer 190 formed on the pixel electrode 210 and the second photosensitive layer 194 formed on the auxiliary electrode 192 may be removed. The first photosensitive layer 190 and the second photosensitive layer 194 may be removed using a photoresist stripping liquid.

As a comparative example of the present disclosure, in a process of forming the auxiliary electrode 192, a layer including the conductive material 192' may be directly formed on the pixel electrode 210, a layer including the second photosensitive material 194' may be formed on the conductive material 192', and the auxiliary electrode 192 may be formed on the pixel-defining layer 180 by concurrently (e.g., simultaneously) patterning the conductive material 192' and the second photosensitive material 194'. However, in the process of forming the auxiliary electrode 192 by patterning the conductive material 192' and the second photosensitive material 194' as described above, there is a problem that a surface of the pixel electrode 210 directly contacted with the auxiliary electrode 192 is peeled off by the etchant for concurrently (e.g., simultaneously) etching the second photosensitive material 194' and the conductive material 192'.

In a method of manufacturing a display device according to an embodiment, the first photosensitive layer 190 may be formed on the pixel electrode 210 exposed by the first opening 181, the conductive material 192' and the second photosensitive material 194', which form the auxiliary electrode 192 and the second photosensitive layer 194, may be sequentially coated on the first photosensitive layer 190, and the auxiliary electrode 192 may be formed on the pixel-defining layer 180 by collectively patterning the conductive material 192' and the second photosensitive material 194'. In forming the auxiliary electrode 192 through the manufacturing method, the conductive material 192' forming the auxiliary electrode 192 and the pixel electrode 210 exposed by the first opening 181 may not be directly contacted with each other, and thus, the problem of peeling off the surface of the pixel electrode 210 exposed by the first opening 181 may be solved.

Figure 8:
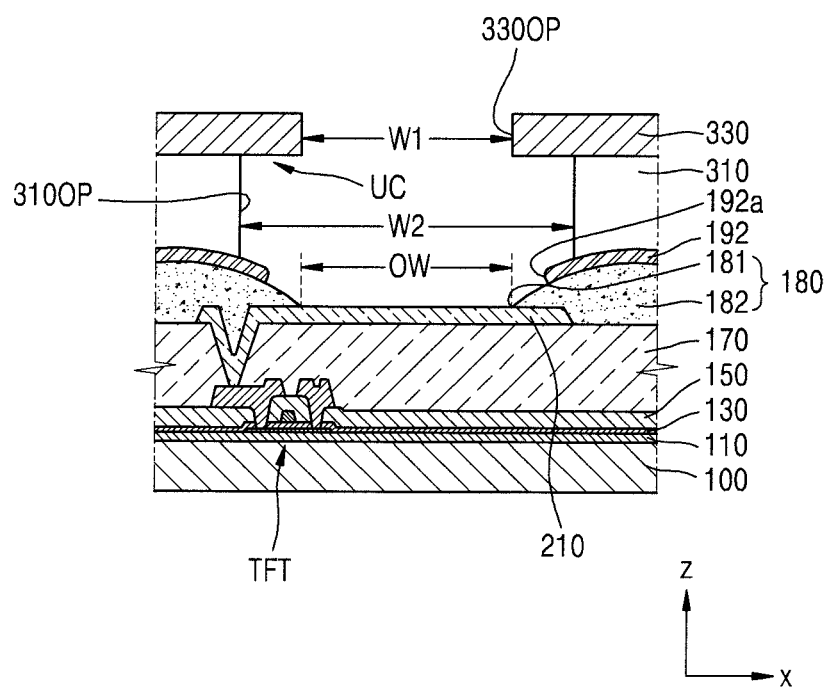

Referring to FIG. 8, a non-photosensitive layer 310 may be formed on the pixel-defining layer 180 on which the auxiliary electrode 192 is formed. A shadow layer 330 may be formed on the non-photosensitive layer 310. The process of forming the non-photosensitive layer 310 and the shadow layer 330 shown in FIG. 8 is as follows.

First, the non-photosensitive layer 310 may be formed to cover the entire (e.g., substantially the entire) substrate 100 on which the pixel-defining layer 180 is formed. The non-photosensitive layer 310 may be integrally formed to cover both the opening 181 and the barrier portion 182 of the pixel-defining layer 180. The non-photosensitive layer 310 may be formed by a coating method, a printing method, a vapor deposition method, or the like.

The non-photosensitive layer 310 may include a fluorine-based non-photosensitive material. The non-photosensitive layer 310 may include, for example, a fluoropolymer, and the fluoropolymer may be formed of a polymer including 20 wt % to 60 wt % of fluorine. For example, a fluoropolymer included in a first lift-off layer 121 may include at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkyl vinylether, a copolymer of chlorotrifluoroethylene and perfluoroalkyl vinylether, a copolymer of tetrafluoroethylene and perfluoroalkyl vinylether, a copolymer of perfluoroalkyl vinylether and perfluoroalkyl vinylether, a copolymer of tetrafluoroethylene and perfluoroalkyl vinylether, or a copolymer of chlorotrifluoroethylene and perfluoroalkyl vinylether.

Thereafter, the shadow layer 330 may be formed on the non-photosensitive layer 310. The shadow layer 330 may also be formed on the entire (e.g., substantially the entire) surface of the non-photosensitive layer 310 to cover the substrate 100 as a whole. In an embodiment, the shadow layer 330 may be a photoresist layer or an inorganic layer. The inorganic layer may be a monolayer or a multilayer including at least one of a metal or an inorganic insulating material. The metal may be formed by atomic layer deposition (ALD) or vapor deposition (e.g., chemical vapor deposition or physical vapor deposition), and examples of the chemical vapor deposition may include atmospheric pressure chemical vapor deposition (APCVD), low pressure chemical vapor deposition (LPCVD), plasma enhanced chemical vapor deposition (PECVD), high density plasma chemical vapor deposition (HDPCVD), and atomic layer chemical vapor deposition (ALCVD), and examples of the physical vapor deposition may include sputtering, thermal evaporation, and E-beam evaporation. The inorganic insulating material may be formed by the vapor deposition such as PECVD.

The shadow layer 330 may be patterned to have a first open area 3300P corresponding to the pixel electrode 210. For example, the first open area 3300P may be formed by etching a portion of the shadow layer 330 using a photoresist on the shadow layer 330. Here, the first open area 3300P may be an area corresponding to the first opening 181. The non-photosensitive layer 310 formed below the shadow layer 330 may then be patterned to have a second open area 3100P.

As shown in FIG. 8, the second open area 3100P may overlap with the first open area 3300P. In the present embodiment, a width W2 of the second open area 3100P may be greater than a width W1 of the first open area 3300P. This is because in this structure the shadow layer 330 is first patterned to have the first open area 3300P and then an undercut structure UC is formed during a process of etching the non-photosensitive layer 310 through the first open area 3300P. The width W2 of the second open area 3100P may be greater than a width OW (or a width of the pixel electrode 210 exposed through the first opening 181) of the first opening 181 of the pixel-defining layer 180. Above all, in the present embodiment, the second open area 3100P may be greater than the second opening 192a of the auxiliary electrode 192. In other words, at least some of the auxiliary electrode 192 may be exposed through the second open area 3100P. As described herein below, this is for electrically contacting the auxiliary electrode 192 exposed through the second open area 3100P and an opposite electrode in a process of forming an intermediate layer 220 and an opposite electrode thereof through the first open area 3300P and the second open area 3100P.

A portion of the non-photosensitive layer 310 may be removed using a solvent capable of etching a material, for example, a fluoropolymer, of the non-photosensitive layer 310. For example, the solvent capable of etching the fluoropolymer may include hydrofluoroether (HFE).

Figure 9:
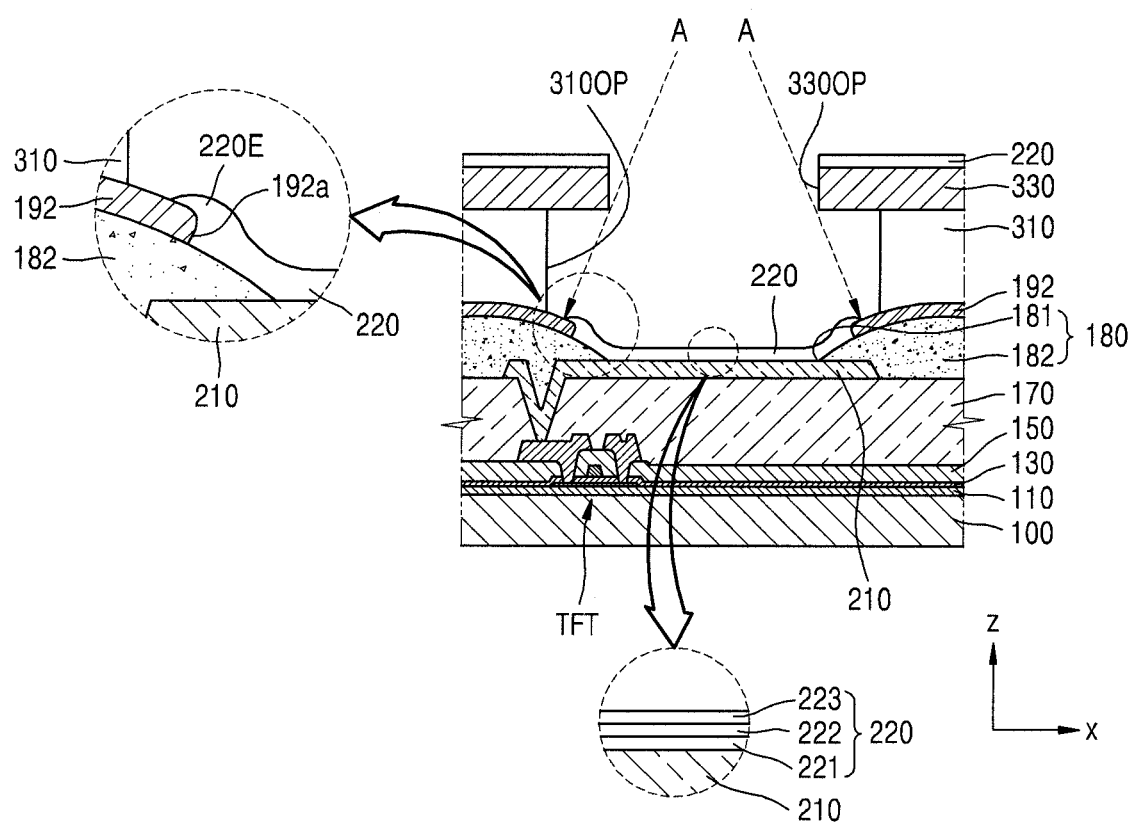

Referring to FIG. 9, the intermediate layer 220 may be formed using a stack of the shadow layer 330 and the non-photosensitive layer 310 having the first and second open areas 3300P and 3100P, respectively. The intermediate layer 220 may be an organic layer including an emission layer. An enlarged view of FIG. 9 includes a first functional layer 221 between the pixel electrode 210 and the EML 222 and a second functional layer 223 opposite to the first functional layer 221 with the EML 222 interposed therebetween.

The intermediate layer 220 may include a low molecular weight material or a polymer material. When the intermediate layer 220 includes a low molecular weight material, the intermediate layer 220 may be formed to have a single or a composite structure by stacking a hole injection layer (HIL), a hole transport layer (HTL), an emission layer (EML) 222, an electron transport layer (ETL), and an electron injection layer (EIL). The intermediate layer 220 may include various suitable organic materials, such as copper phthalocyanine (CuPc), N,N'-Di(naphthalene-1-yl)-N,N'-diphenyl-benzidine (NPB), and/or tris-8-hydroxyquinoline aluminum (Alq3). The HIL and the HTL may correspond to the first functional layer 221 in FIG. 9, and the ETL and the EIL may correspond to the second functional layer 223, respectively.

When the intermediate layer 220 includes a polymer material, the intermediate layer 220 may have a structure including the first functional layer 221 including the HTL and the EML 222. The HTL may include poly(3,4-ethylenedioxythiophene) (PEDOT) and the EML may include a polymer material, such as poly-phenylenevinylene (PPV) and polyfluorene.

The intermediate layer 220 may be formed by vacuum deposition. In an embodiment, the intermediate layer 220 may be formed by thermal deposition in a vacuum state.

In forming the intermediate layer 220, a material constituting the intermediate layer 220 is formed (e.g., deposited) on at least the pixel electrode 210 in a direction oblique to a direction (a z-direction) perpendicular (e.g., substantially perpendicular) to an upper surface of the pixel electrode 210 along, for example, a path "A" of FIG. 9. For example, as shown in another enlarged view of FIG. 9, the material constituting the intermediate layer 220 may be deposited on the pixel electrode 210, an upper surface of the barrier portion 182 adjacent to the pixel electrode 210, and the auxiliary electrode 192. A width of the intermediate layer 220 may be formed to be greater than a width of the pixel electrode 210 exposed through the first opening 181 so that an end portion 220E of the intermediate layer 220 may be in contact with the upper surface of the barrier portion 182 adjacent to the pixel electrode 210.

In an embodiment, in another enlarged view of FIG. 9, the end portion 220E of the intermediate layer 220 may directly contact the auxiliary electrode 192 exposed through the second open area 3100P. However, the present disclosure is not limited thereto. It is sufficient if the width of the intermediate layer 220 is formed greater than the width of the pixel electrode 210 exposed through the first opening 181. Meanwhile, when the end portion 220E of the intermediate layer 220 directly contacts the auxiliary electrode 192 exposed through the second open area 3100P, the end portion 220E of the intermediate layer 220 needs to be spaced apart from the non-photosensitive layer 310 by a set (or predetermined) distance. The opposite electrode 230 to be described herein below contacts the auxiliary electrode 192 through the set (or predetermined) distance between the end portion 220E of the intermediate layer 220 and the non-photosensitive layer 310.

Figure 10:
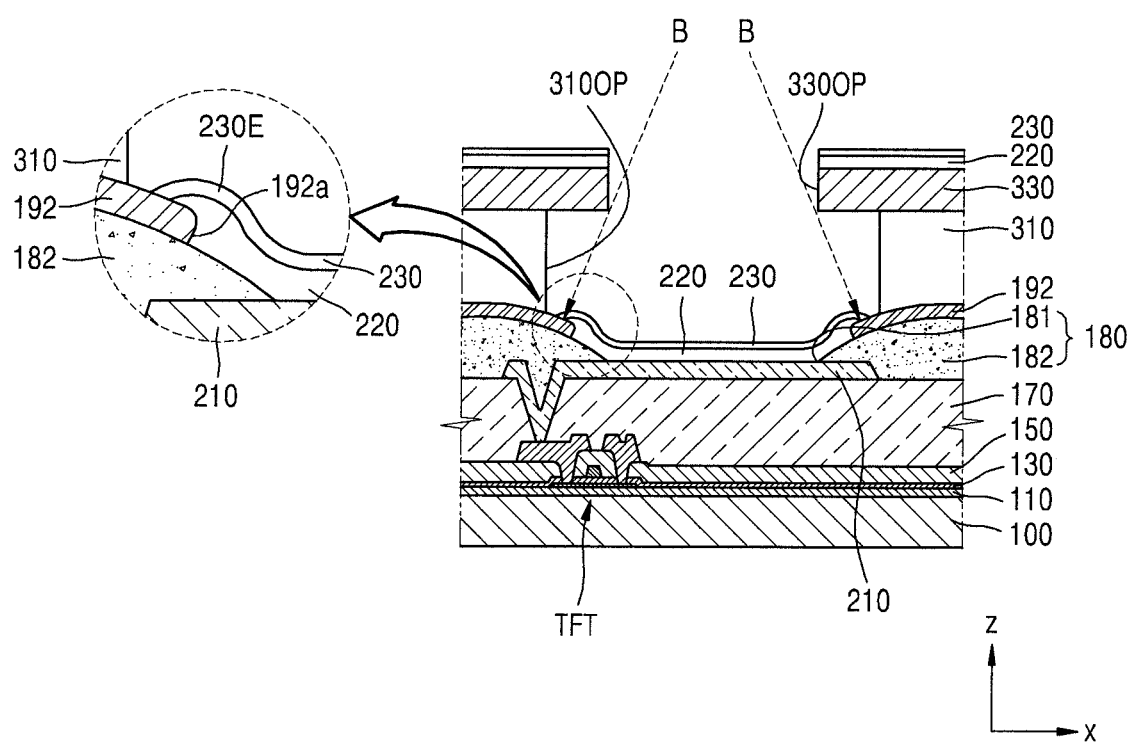

As shown in FIG. 10, the opposite electrode 230 may be formed using a stack of the shadow layer 330 and the non-photosensitive layer 310 having the first and second open areas 3300P and 3100P, respectively.

The opposite electrode 230 may be formed by vacuum deposition. The opposite electrode 230 may be formed by physical vapor deposition such as thermal deposition or sputtering in a vacuum state. For example, when the opposite electrode 230 is formed by using the stack of the shadow layer 330 and the non-photosensitive layer 310 in the same (e.g., substantially the same) manner as the intermediate layer 220 and by the same (e.g., substantially the same) method (e.g., thermal deposition) as in the intermediate layer 220, a manufacturing process of a display device may be simplified, and the intermediate layer 220 and the opposite electrode 230 may be formed in an identical chamber. Therefore, it is possible to prevent (or reduce) introduction of impurities or formation of an unnecessary layer due to discontinuity of processes for forming the intermediate layer 220 and a conductive layer and/or discontinuity of a chamber in which the intermediate layer 220 and the conductive layer are formed.

The opposite electrode 230 may be an electrode (conductive layer) facing the pixel electrode 210, and may be a reflective electrode or a transparent electrode in this case. Alternatively, the opposite electrode 230 may be a conductive protective layer for protecting the intermediate layer 220.

The opposite electrode 230 may include a conductive metal layer containing Ag, Mg, Al, ytterbium (Yb), calcium (Ca), lithium (Li), Au or a compound thereof, and/or may include a conductive oxide layer such as a transparent conductive oxide (TCO) layer. The transparent conductive oxide may include ITO, IZO, ZnO, In2O3, IGO, or AZO. In an embodiment, the opposite electrode 230 may be an alloy containing Ag and Mg (e.g., containing Ag more than Mg), and may be formed as a multilayer including ITO or a monolayer including the above-described materials.

In forming the opposite electrode 230, a material constituting the opposite electrode 230 may be deposited on the intermediate layer 220 in a direction oblique to a direction perpendicular (e.g., substantially perpendicular) to the substrate 100 (the z-direction), for example, along a path "B" of FIG. 10. For example, the material constituting the opposite electrode 230 may be formed to cover the intermediate layer 220 as shown in another enlarged view of FIG. 10, and may directly contact the auxiliary electrode 192 exposed through the second open area 3100P. For example, a width of the opposite electrode 230 may be formed to be greater than a width of the intermediate layer 220, and an end portion 230E of the opposite electrode 230 may be in electrical contact with the auxiliary electrode 192.

Figure 11:
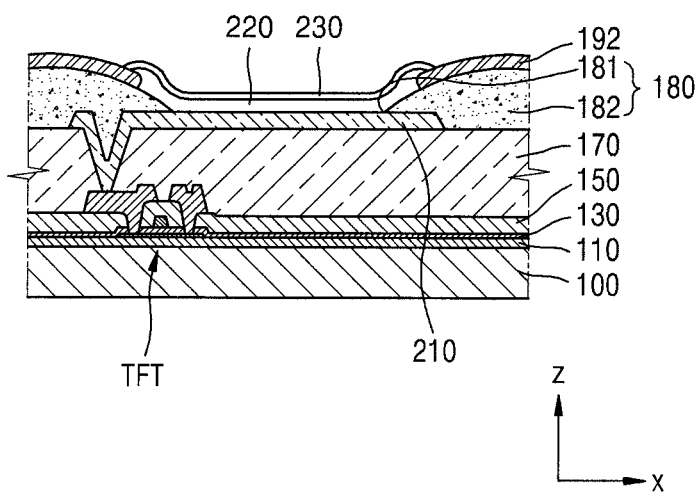

Referring to FIG. 11, after forming the opposite electrode 230, the non-photosensitive layer 310 and the shadow layer 330 may be removed. For example, the shadow layer 330 and a material of the intermediate layer 220 on the shadow layer 330 are also removed while lifting off the non-photosensitive layer 310 using a solvent or the like that etches the non-photosensitive layer 310.

Although a method of manufacturing a display device has been described so far, the present disclosure is not limited thereto. For example, a display device manufactured by the method of manufacturing a display device may also be within the scope of the present disclosure.

The display device manufactured through the above-described processes of FIGS. 1-11 is the same as that shown in FIG. 11.

Figure 12:
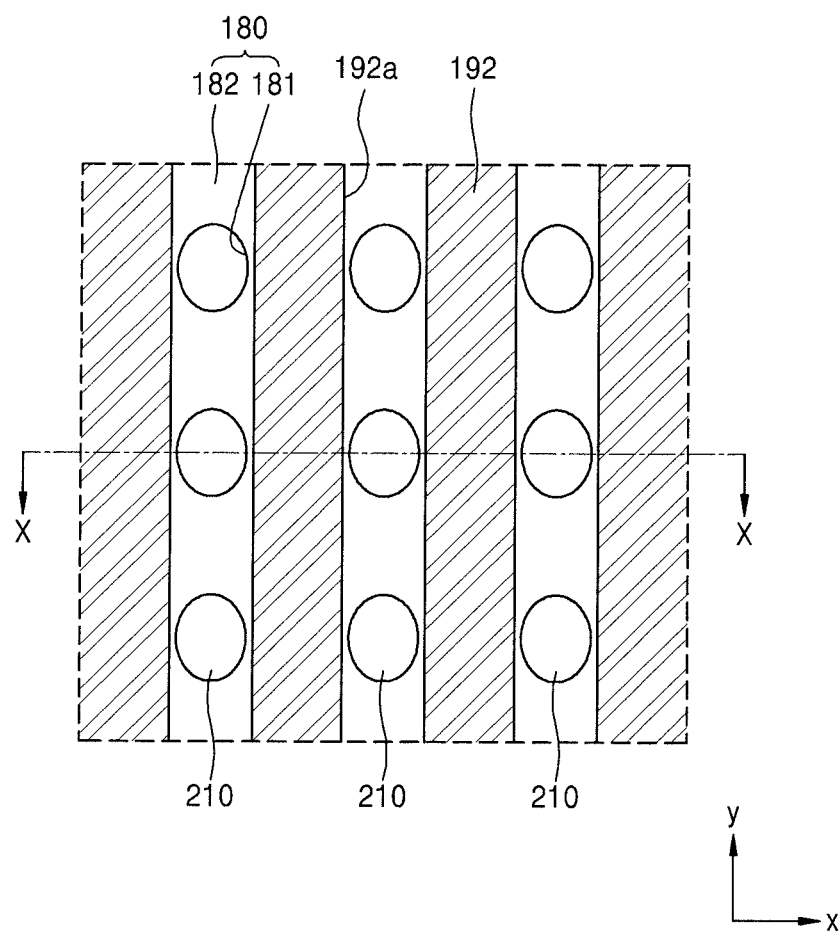
FIG. 12 is a plan view of a display device according to an embodiment.
Figure 13:
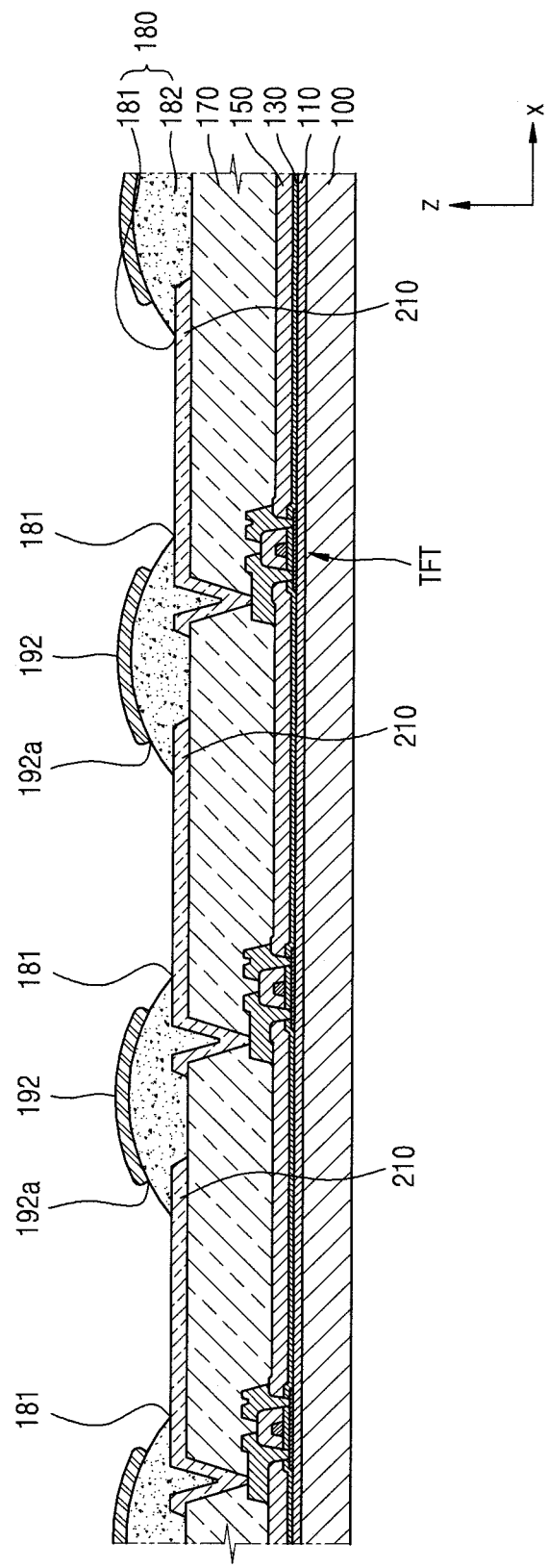
FIG. 13 is a cross-sectional view taken along a line X-X of the display device of FIG. 12.

FIG. 12 is a plan view of a display device according to an embodiment, and FIG. 13 is a cross-sectional view taken along a line X-X of the display device of FIG. 12.

FIGS. 12-13 show a display device having a plurality of pixels, for example, a red pixel, a green pixel, and a blue pixel.

Referring to FIGS. 12-13, a plurality of pixel electrodes 210 may be provided on the substrate 100. The plurality of pixel electrodes 210 may be spaced apart from each other and patterned. The thin-film transistor TFT and a storage capacitor are formed before each pixel electrode 210 is formed, and as described above with reference to FIG. 1, the buffer layer 110, the gate insulating layer 130, the interlayer dielectric layer 150, the planarization insulating layer 170, and the like may be formed. Each pixel electrode 210 includes an identical material and is formed in an identical process.

The pixel-defining layer 180 may be provided on the pixel electrodes 210. The pixel-defining layer 180 may include a plurality of first openings 181 exposing a central portion of each of the pixel electrodes 210 and the barrier portion 182 covering an end portion of each of the pixel electrodes 210. A process of forming the pixel-defining layer 180 is as described above with reference to FIG. 2.

The auxiliary electrode 192 may be arranged on the barrier portion 182 of the pixel-defining layer 180. The auxiliary electrode 192 may extend in a first direction (a y-direction) as shown in FIG. 12. In another embodiment, a plurality of auxiliary electrodes 192 may be formed in a mesh shape on the barrier portion 182 of the pixel-defining layer 180 except for the plurality of first openings 181. The auxiliary electrode 192 may have a plurality of second openings 192a corresponding to the plurality of first openings 181, respectively. In the present embodiment, the second opening 192a may be greater than the first opening 181.

Figure 14:
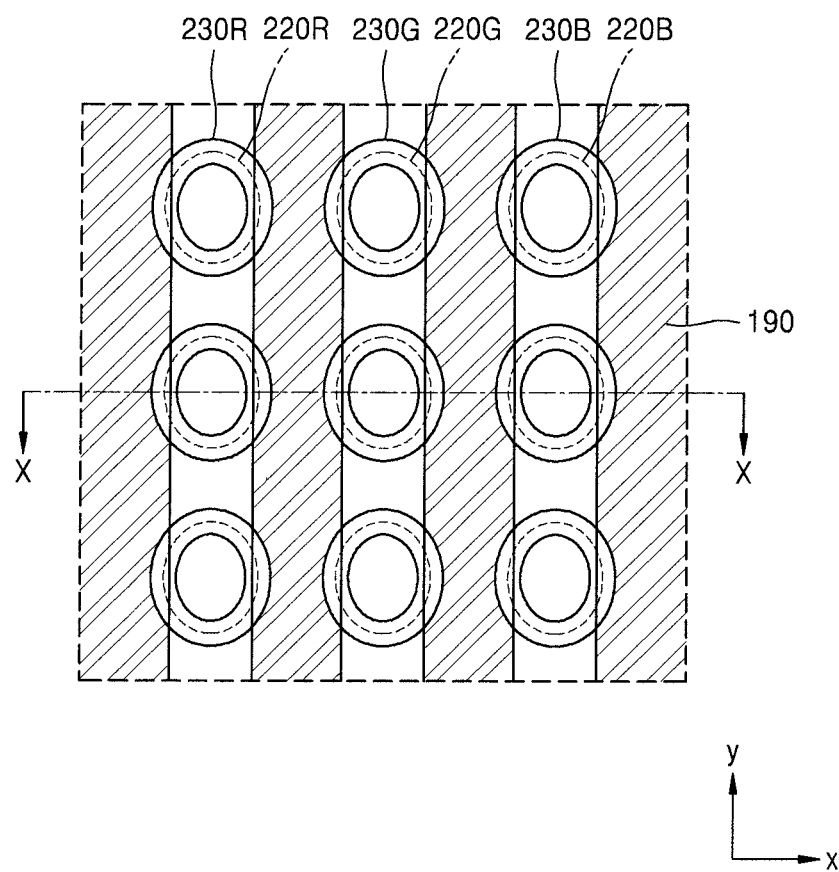
FIG. 14 is a plan view of a display device according to an embodiment.
Figure 15:
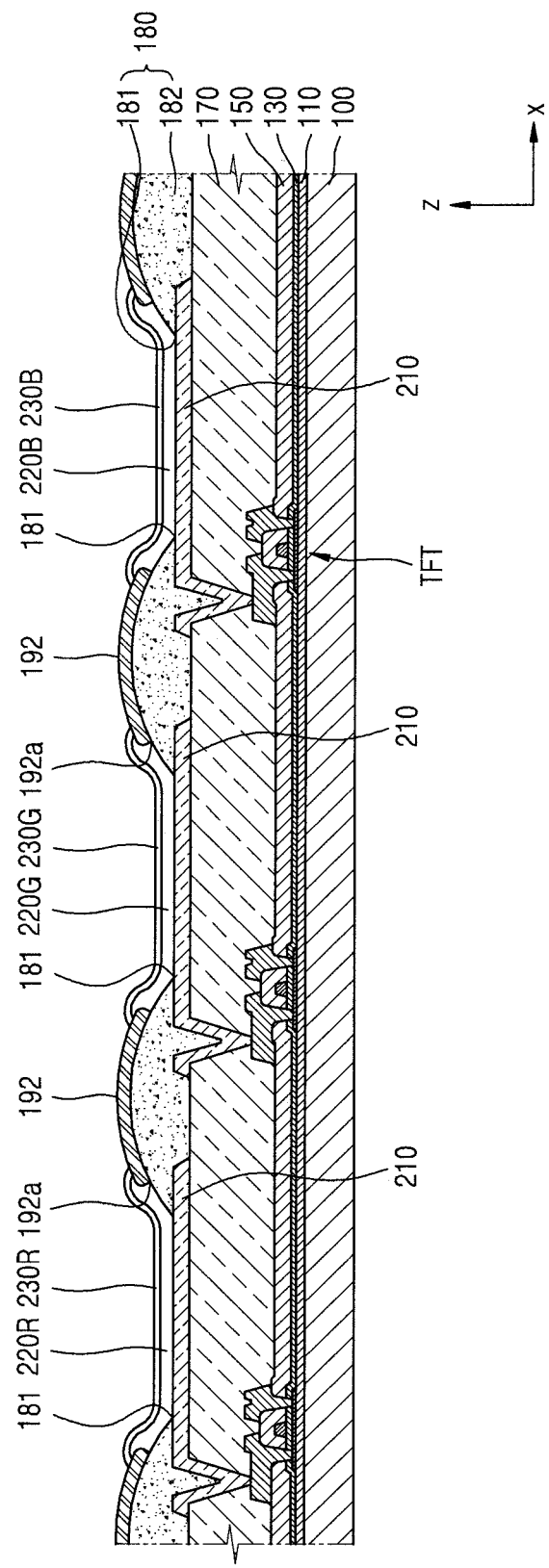
FIG. 15 is a cross-sectional view taken along a line X-X of the display device of FIG. 14.

FIG. 14 is a plan view of a display device according to an embodiment, and FIG. 15 is a cross-sectional view taken along a line X-X of the display device of FIG. 14.

FIGS. 14-15 show a structure in which an intermediate layer 220R, 220G, or 220B and an opposite electrode 230R, 230G, or 230B are formed on the pixel electrodes 210 in FIGS. 12-13, respectively.

Referring to FIGS. 14-15, the intermediate layer 220R that emits red light, the intermediate layer 220G that emits green light, and the intermediate layer 220B that emits blue light are provided on the substrate 100. The red, green, and blue intermediate layers 220R, 220G, and 220B are formed in separate processes, respectively. The red, green, and blue intermediate layers 220R, 220G, and 220B may be formed independently. For example, the red, green, and blue intermediate layers 220R, 220G, and 220B may be formed individually using the non-photosensitive layer 310 and the shadow layer 330 each having open areas according to the processes described with reference to FIGS. 3-11.

Meanwhile, as described above with reference to FIG. 11, the non-photosensitive layer 310 and the shadow layer 330 are removed after the red, green, and blue intermediate layers 220R, 220G, and 220B are formed on the pixel electrodes 210 in each process. For example, the shadow layer 330 and a material of the intermediate layer 220 on the shadow layer 330 are also removed while lifting off the non-photosensitive layer 310 using a solvent or the like that etches the non-photosensitive layer 310.

In the present embodiment, the intermediate layers 220R, 220G, and 220B may be in contact with at least a portion of the auxiliary electrode 192. intermediate layers 220R, 220G, and 220B. This can be understood to be due to the fact that a portion of the auxiliary electrode 192 is exposed by the second open area 310OP of the non-photosensitive layer 310, as described above with respect to FIG. 9.

On the other hand, the opposite electrode 230R may be provided on the intermediate layer 220R that emits red light. Similarly, an opposite electrode 230G may be provided on the intermediate layer 220G that emits green light, and an opposite electrode 230B may be provided on the intermediate layer 220B that emits blue light. In the present embodiment, the opposite electrodes 230R, 230G, and 230B may be formed in separate processes, respectively. As shown in FIG. 13, each of the opposite electrodes 230R, 230G, and 230B may be greater than the intermediate layers 220R, 220G, and 220B so as to cover the intermediate layers 220R, 220G, and 220B.

According to the processes described with reference to FIGS. 3-11, the intermediate layer 220R and the opposite electrode 230R corresponding to red pixels are formed by using the non-photosensitive layer 310 and the shadow layer 330 each having open areas, the shadow layer 330 and the intermediate layer 220R and the opposite electrode 230R on the shadow layer 330 are removed by lifting off the intermediate layer 220R and the opposite electrode 230R using a solvent or the like that etches the non-photosensitive layer 310, and the intermediate layer 220R and the opposite electrode 230R may be formed on the pixel electrode 210. Thereafter, according to the processes described with reference to FIGS. 3-11, the intermediate layer 220G corresponding to green pixels and the opposite electrode 230G may be formed, and the intermediate layer 220G and the opposite electrode 230G may be left only on the pixel electrode 210 by using the lift-off process. Similarly, according to the processes described with reference to FIGS. 3-11, the intermediate layer 220B and the opposite electrode 230B corresponding to blue pixels may be formed on the pixel electrode 210. Each of the opposite electrodes 230R, 230G, and 230B may serve to protect the intermediate layers 220R, 220G, and 220B from a solvent or the like in the lift-off process.

Each of the opposite electrodes 230R, 230G, and 230B may be provided to contact at least a portion of the auxiliary electrode 192. In an embodiment, according to a method of manufacturing the intermediate layers 220R, 220G and 220B and the opposite electrodes 230R, 230G and 230B using a stack of the shadow layer 330 and the non-photosensitive layer 310 respectively having the first and second open areas 3300P and 3100P, the opposite electrodes 230R, 230G, and 230B are spaced apart from each other and provided in each pixel. The opposite electrodes 230R, 230G and 230B should be electrically coupled to (e.g., electrically connected to) each other in order to apply voltages to the opposite electrodes 230R, 230G, and 230B, and this may be achieved through the auxiliary electrode 192. Voltages may be collectively applied to the opposite electrodes 230R, 230G, and 230B that are spaced apart from each other as each of the opposite electrodes 230R, 230G, and 230B is in electrical contact with the auxiliary electrode 192.

FIGS. 12-15 show that a display device includes red, green, and blue pixels, but is not limited thereto. In another embodiment, the display device may also include red, green, blue, and white pixels.

According to an embodiment as described above, a display device provided with a high-quality intermediate layer and/or a conductive layer on a pixel electrode, and a method of manufacturing the same may be implemented. However, the scope of the present disclosure is not limited to the embodiments described herein.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing a display device, the method comprising:
   forming a pixel electrode on a substrate;
   forming a pixel-defining layer having a first opening exposing a central portion of the pixel electrode and a barrier portion defining the first opening;
   forming a first photosensitive layer on the pixel electrode so as to cover the first opening;
   forming an auxiliary electrode on the barrier portion, wherein the auxiliary electrode has a second opening exposing the first photosensitive layer;
   forming a second photosensitive layer on the auxiliary electrode, wherein the second photosensitive layer has a third opening exposing the first photosensitive layer; and
   removing the first photosensitive layer and the second photosensitive layer.

2. The method of claim 1, wherein the forming of the first photosensitive layer comprises forming a first photosensitive material on an entire surface of the substrate to cover the pixel-defining layer and the central portion of the pixel electrode and patterning the first photosensitive material.

3. The method of claim 1, wherein the forming of the auxiliary electrode comprises forming a conductive material on an entire surface of the substrate to cover the first photosensitive layer and patterning the conductive material to form a second opening, and
   the forming of the second photosensitive layer comprises forming a second photosensitive material on the conductive material, and patterning the second photosensitive material to form a third opening.

4. The method of claim 3, wherein the forming of the second opening and the forming of the third opening are performed concurrently.

5. The method of claim 3, wherein the second opening is larger than the first opening.

6. The method of claim 1, further comprising:
   forming a non-photosensitive layer on the auxiliary electrode;
   forming a shadow layer having a first open area on the non-photosensitive layer to correspond to the pixel electrode;
   forming a second open area in the non-photosensitive layer, which is larger than the first open area, to correspond to the first open area;
   forming an intermediate layer on the pixel electrode through the first open area and the second open area; and
   forming an opposite electrode on the intermediate layer through the first open area and the second open area.

7. The method of claim 6, wherein the intermediate layer and the opposite electrode contact the auxiliary electrode.

8. The method of claim 6, wherein the second open area is formed to be larger than the second opening of the auxiliary electrode to expose at least a portion of the auxiliary electrode.

9. The method of claim 1, wherein the auxiliary electrode comprises aluminum (Al).

* * * * *